United States Patent
Chou

(10) Patent No.: US 9,059,376 B2
(45) Date of Patent: Jun. 16, 2015

(54) ILLUMINATING DEVICE

(71) Applicant: LEXTAR ELECTRONICS CORPORATION, Hsinchu (TW)

(72) Inventor: Yen-Chih Chou, Hsinchu County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/251,554

(22) Filed: Apr. 11, 2014

(65) Prior Publication Data

US 2015/0137157 A1    May 21, 2015

(30) Foreign Application Priority Data

Nov. 20, 2013    (TW) .............................. 102142195 U

(51) Int. Cl.
| | |
|---|---|
| *H01L 29/22* | (2006.01) |
| *H01L 33/00* | (2010.01) |
| *H01L 33/38* | (2010.01) |
| *H01L 33/50* | (2010.01) |
| *H01L 33/54* | (2010.01) |
| *H01L 33/48* | (2010.01) |

(52) U.S. Cl.
CPC ............ *H01L 33/382* (2013.01); *H01L 33/507* (2013.01); *H01L 33/54* (2013.01); *H01L 33/48* (2013.01); *H01L 2924/12041* (2013.01)

(58) Field of Classification Search
CPC ...................... H01L 33/48; H01L 2924/12041
See application file for complete search history.

(56) References Cited

U.S. PATENT DOCUMENTS

| | | | | |
|---|---|---|---|---|
| 8,455,910 | B2 * | 6/2013 | Chiang et al. | 257/99 |
| 2007/0108460 | A1 * | 5/2007 | Lee et al. | 257/98 |
| 2009/0053839 | A1 * | 2/2009 | Kim et al. | 438/26 |
| 2010/0133565 | A1 * | 6/2010 | Cho et al. | 257/98 |
| 2010/0264439 | A1 * | 10/2010 | Chen et al. | 257/98 |
| 2012/0012868 | A1 * | 1/2012 | Chang et al. | 257/91 |
| 2012/0106155 | A1 * | 5/2012 | Hata et al. | 362/249.02 |
| 2013/0170208 | A1 * | 7/2013 | Kuwaharada et al. | 362/243 |
| 2014/0022643 | A1 * | 1/2014 | Hirokubo | 359/578 |
| 2014/0124812 | A1 * | 5/2014 | Kuramoto et al. | 257/98 |
| 2014/0131747 | A1 * | 5/2014 | West et al. | 257/88 |
| 2014/0268783 | A1 * | 9/2014 | Agatani et al. | 362/249.06 |
| 2014/0328083 | A1 * | 11/2014 | Oh et al. | 362/612 |

FOREIGN PATENT DOCUMENTS

| | | |
|---|---|---|
| TW | 201230410 | 7/2012 |
| TW | 201236117 | 9/2012 |
| WO | WO 2013/099936 | 7/2013 |

OTHER PUBLICATIONS

Taiwan Patent Office, Office Action, Patent Application Serial No. 102142195, Feb. 25, 2015, Taiwan.

* cited by examiner

*Primary Examiner* — Ida M Soward

(57) ABSTRACT

An illuminating device including a substrate, a light-emitting diode element disposed on the substrate, an electrode element, and a sealing ring. The substrate has a groove, and the electrode element has a retaining slot disposed in the groove. The sealing ring is embedded into the retaining slot and a part of the groove to tightly fix the electrode element on the groove.

16 Claims, 6 Drawing Sheets

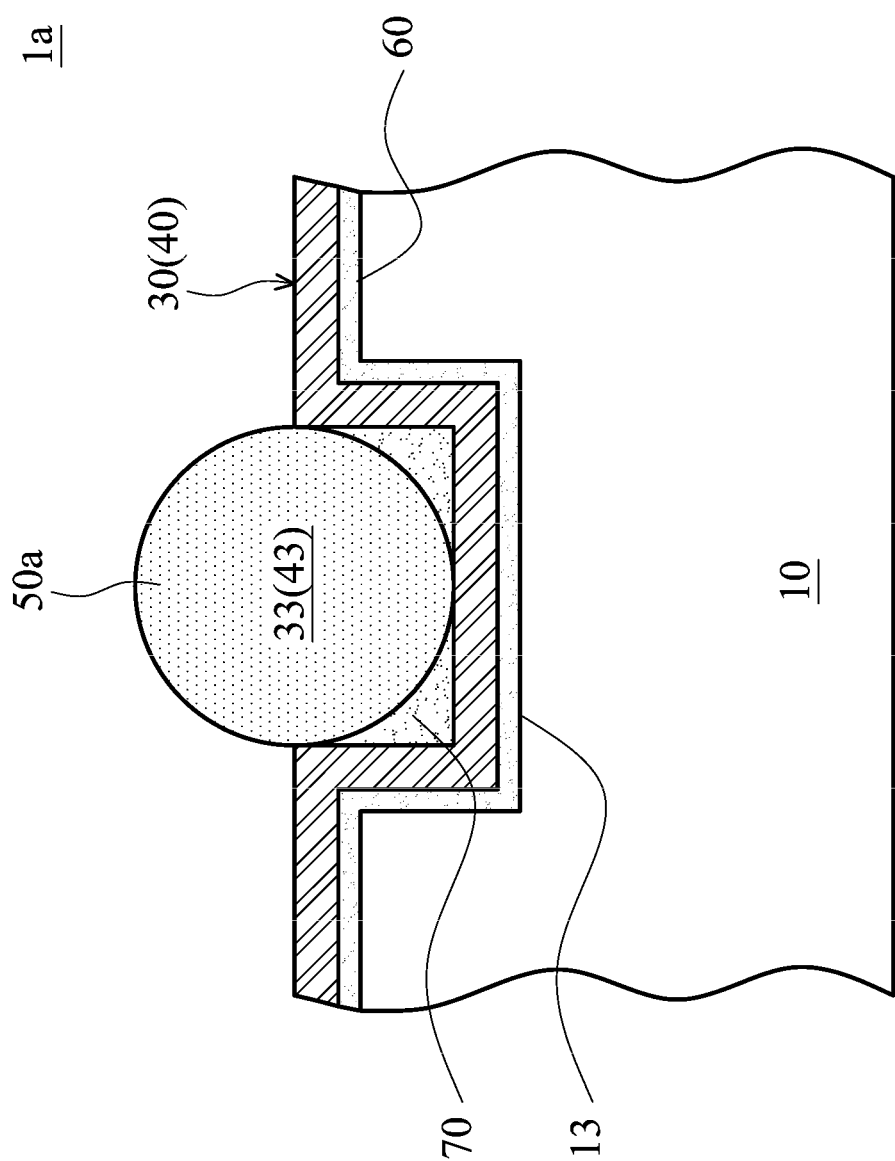

ILLUMINATING DEVICE

CROSS-REFERENCE TO RELATED APPLICATIONS

This Application claims priority of Taiwan Patent Application No. 102142195, filed on Nov. 20, 2013, the entirety of which is incorporated by reference herein.

BACKGROUND OF THE INVENTION

1. Field of the Invention

The present disclosure relates to an illuminating device, and in particular to an illuminating device having light-emitting diode elements.

2. Description of the Related Art

In conventional chip-on-board light-emitting diodes (COB LEDs), LED chips are disposed on a metal core printed circuit board (MCPCB). As shown in FIG. 1, a conventional illuminating device A1 includes a MCPCB A1 and a light-emitting diode chip A20. The MCPCB A1 includes a metal substrate A11, an insulation layer A12, and a copper layer A13 overlaid in sequence. The light-emitting diode chip A20 is disposed on the copper layer A13. The metal substrate A11 is configured to dissipate the heat generated by the light-emitting diode chip A20. The copper layer A13, as an electrode element, is electrically connected to the light-emitting diode chip A20.

However, the copper layer A13 is attached on the metal substrate A11 via the insulation layer A12. During a manufacturing process of the illuminating device 1, the insulation layer A12 is easily deteriorated, and thus the copper layer A13 is easily peeled from the metal substrate A11, and the yield rate of the illuminating device is decreased.

BRIEF SUMMARY OF THE INVENTION

To solve these problems, the present disclosure provides an illuminating device. The electrode element of the illuminating device is tightly retained on the substrate.

The present disclosure provides an illuminating device including a substrate, a light-emitting diode element, a first electrode element, a second electrode element, and a sealing ring. The substrate has an upper surface, a die bond area located at the upper surface, and a groove around the die bond area. The light-emitting diode element is disposed on the die bond area. The first electrode element has a first electrical-connection portion, a second electrical-connection portion, and a first retaining slot is located between the first and second electrical-connection portions.

Furthermore, the first retaining slot is disposed in the groove, and the first and second electrical-connection portions are respectively electrically connected to the die bond area and an external power source. The second electrode element has a third electrical-connection portion, a fourth electrical-connection portion, and a second retaining slot located between the third and fourth electrical-connection portions. The second retaining slot is disposed in the groove, and the third and fourth electrical-connection portions are respectively electrically connected to the die bond area and the external power source. The sealing ring is embedded in a portion of the groove and the first and second retaining slots to keep the first and second electrode elements retained in the groove.

In conclusion, the illuminating device of the present disclosure utilizes the sealing ring to tightly retain the electrode element on the substrate. Therefore, the electrode element does not easily separate from the substrate, and the yield rate of the illuminating device is improved.

BRIEF DESCRIPTION OF THE DRAWINGS

The invention can be more fully understood by reading the subsequent detailed description and examples with references made to the accompanying drawings, wherein:

FIG. 6 is a cross-sectional view of an illuminating device in accordance with a second embodiment of the disclosure.

DETAILED DESCRIPTION OF THE INVENTION

Figure 1:
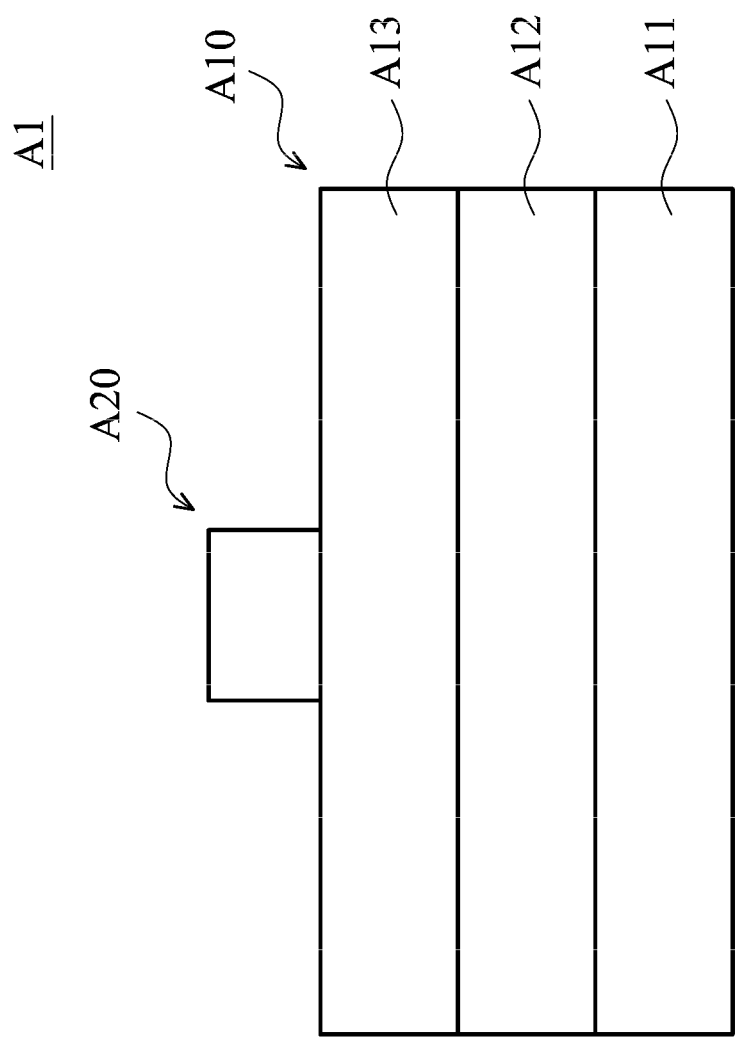
FIG. 1 is a cross-sectional view of a conventional illuminating device.
Figure 2:
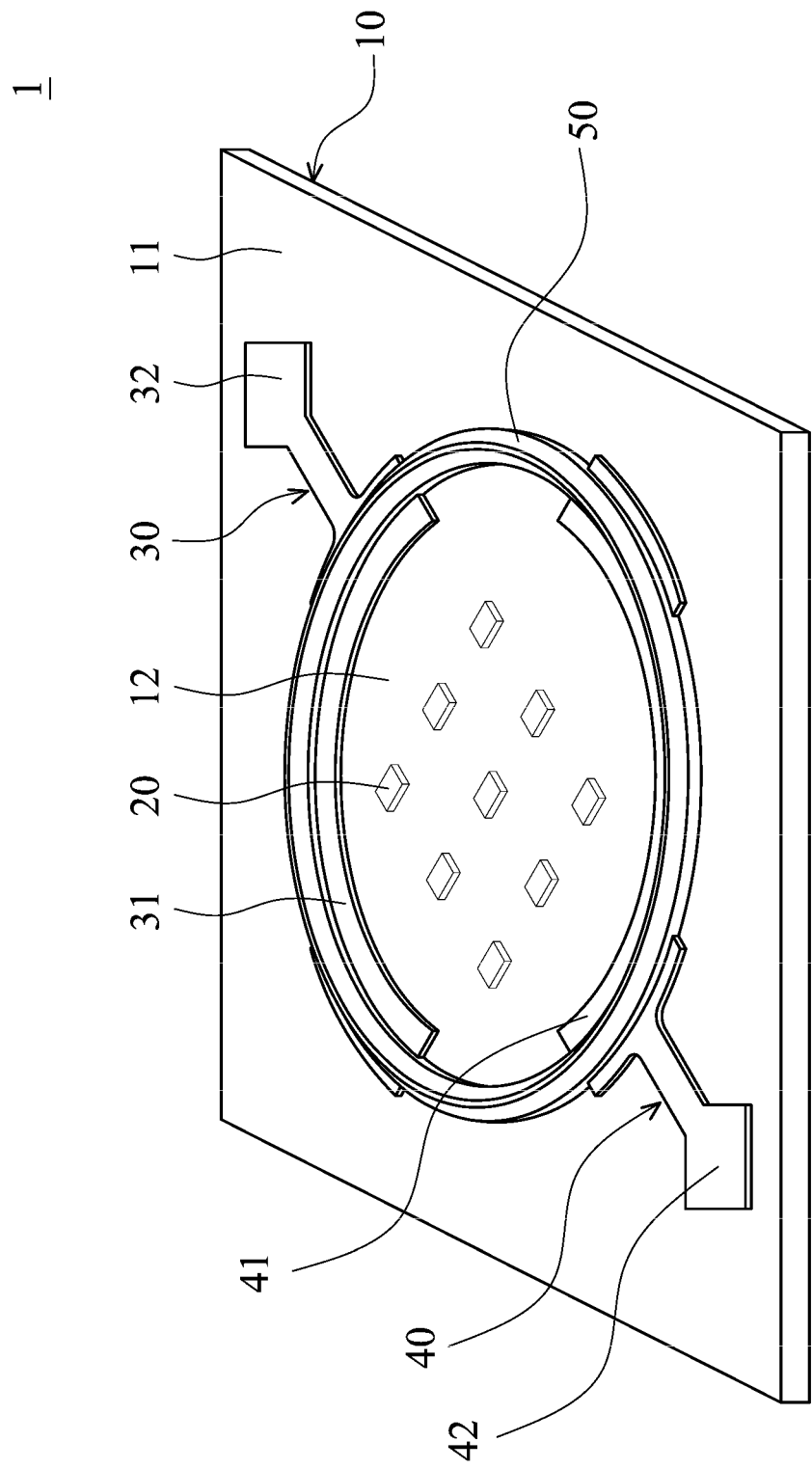
FIG. 2 is a perspective view of an illuminating device in accordance with a first embodiment of the disclosure.
Figure 3:
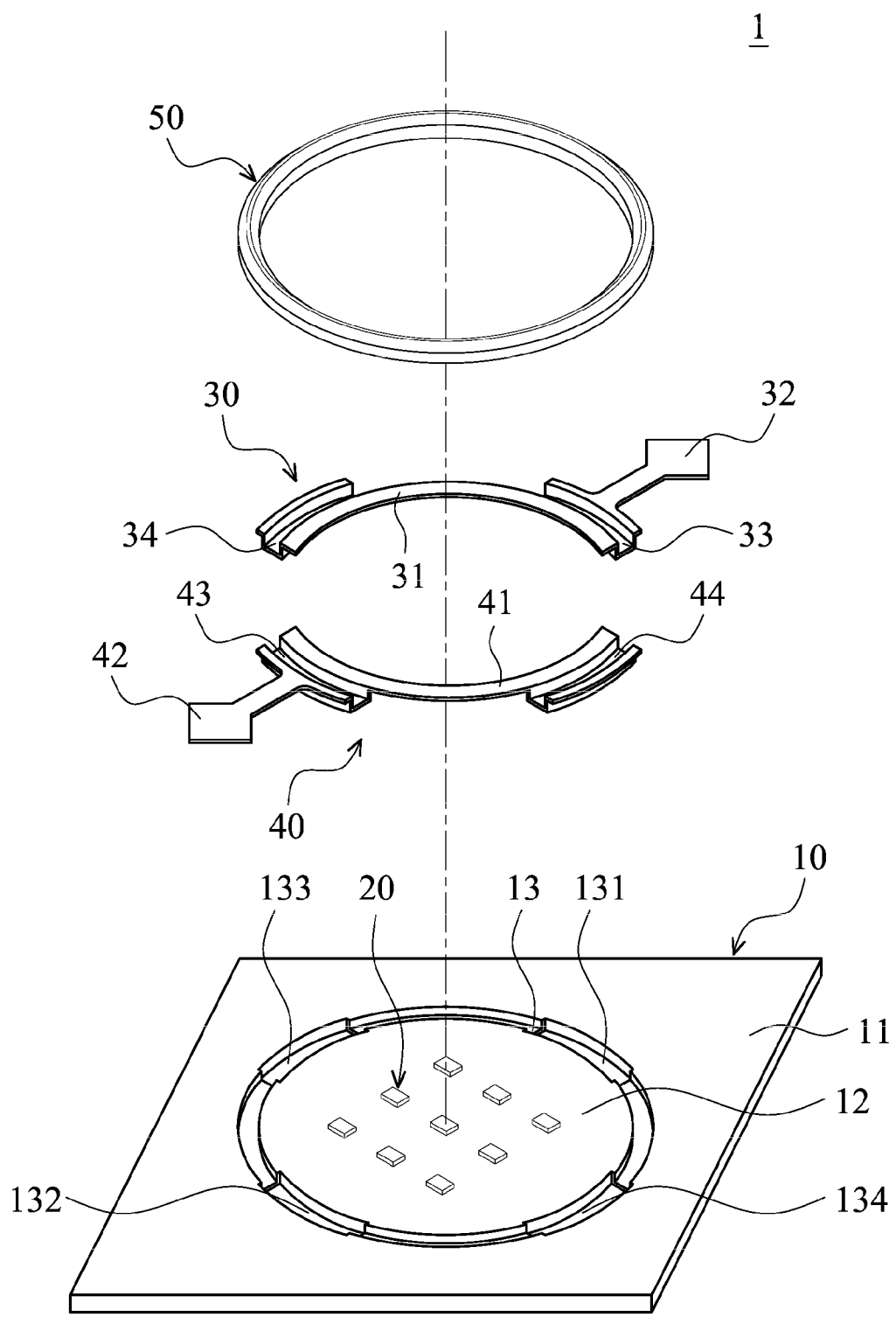
FIG. 3 is an exploded view of the illuminating device in accordance with the first embodiment of the disclosure.
Figure 4:
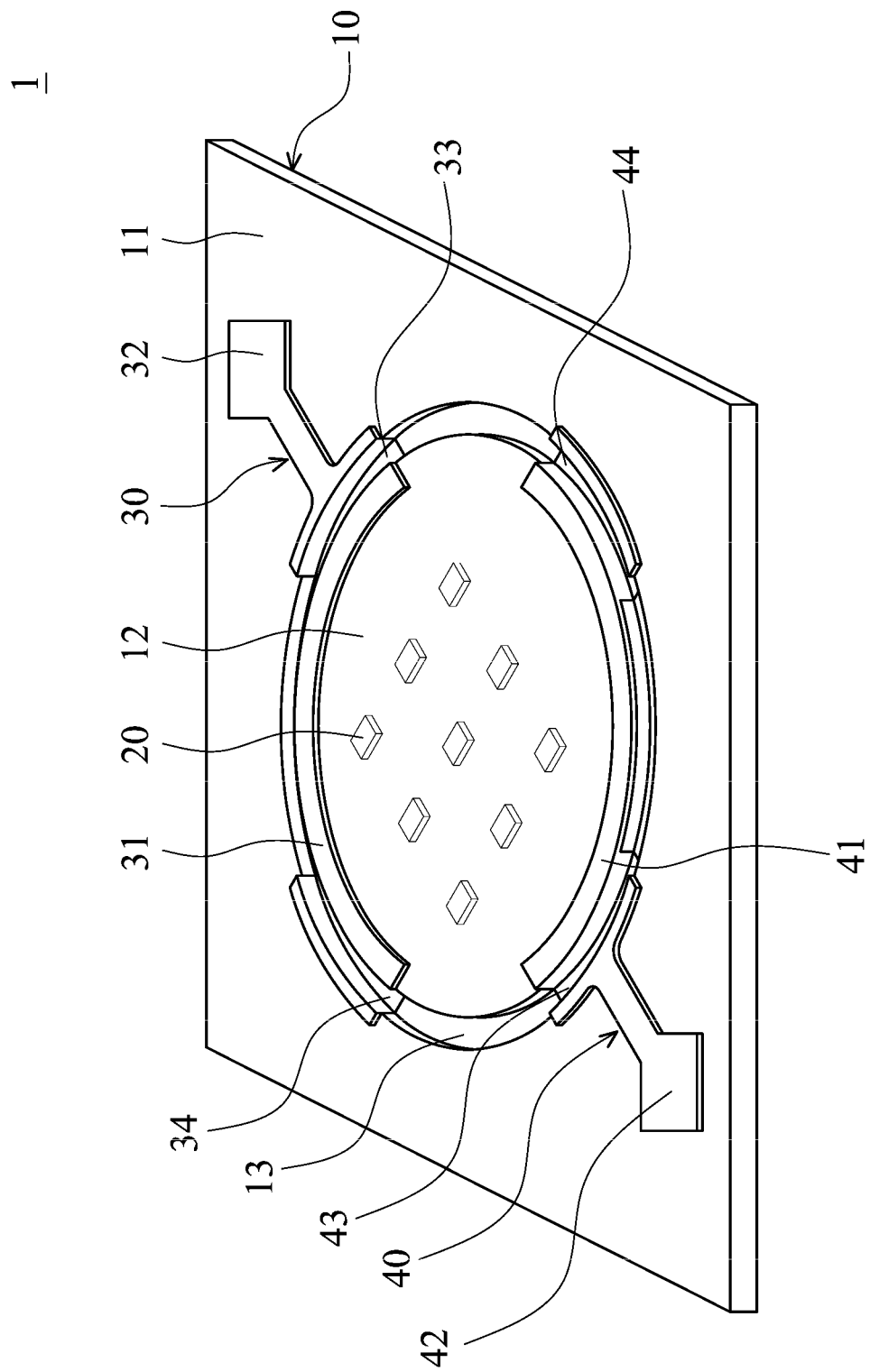
FIG. 4 is a perspective view of a substrate, a first and a second electrode element in accordance with the first embodiment.
Figure 5:
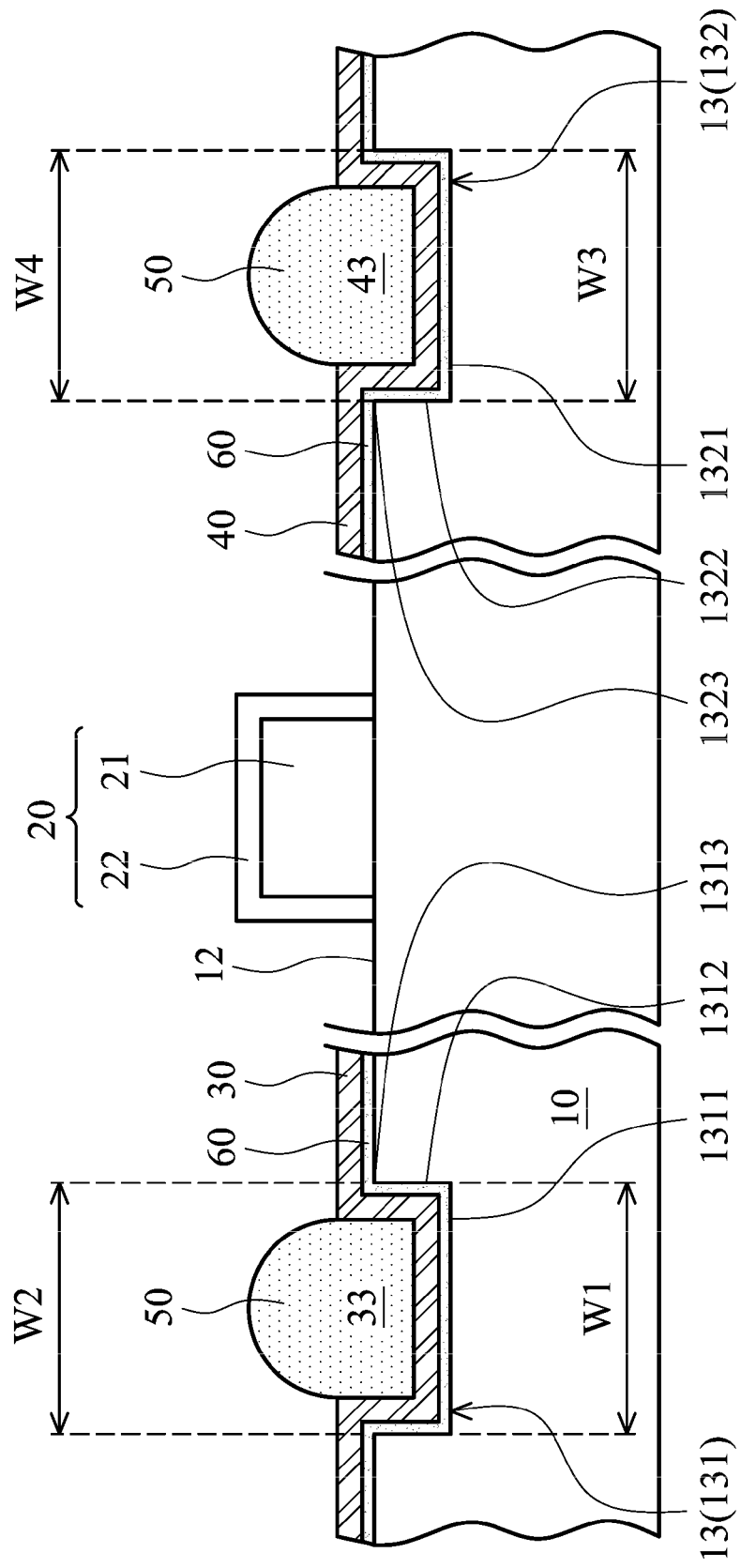
FIG. 5 is a cross-sectional view of the illuminating device in accordance with the first embodiments of the disclosure.

FIG. 2 is a perspective view of an illuminating device 1 in accordance with a first embodiment of the disclosure. FIG. 3 is an exploded view of the illuminating device 1 in accordance with the first embodiment of the disclosure. FIG. 4 is a perspective view of a substrate 10, a first and a second electrode element 30 in accordance with the first embodiment. FIG. 5 is a cross-sectional view of the illuminating device 1 in accordance with the first embodiment of the disclosure. The illuminating device 1 includes a substrate 10, a number of light-emitting diode elements 20, a first electrode element 30, a second electrode element 40, and a sealing ring 50.

The substrate 10 may be a thermal conductive substrate or a metal core printed circuit board (MCPCB). The substrate 10 is made of a metal, a conductive material, a ceramic material or a thermosetting plastic material. The substrate 10 may be a metal or a conductive material performed with an anodizing process. The substrate 10 has an upper surface 11, a die bond area 12 located at the upper surface 11 and a groove 13 around the die bond area 12. The groove 13 may be a ring-like rectangle or circle.

The light-emitting diode elements 20 may be arranged on the die bond area 12 in an array. The light-emitting diode elements 20 may be light-emitting diode chips or light-emitting diode packages. In some embodiments, there is only one light-emitting diode element 20 in the illuminating device 1. The first electrode element 30 or the second electrode element 40 is excluded in the illuminating device 1. In some embodiments, at least three electrode elements are included in the illuminating device 1.

The first electrode element 30 is made of a metal or a conductive material. The first electrode element 30 has a first electrical-connection portion 31 and a second electrical-connection portion 32. The first and second electrical-connection portions 31 and 32 are respectively electrically connected to the die bond area 12 and an external power source (not shown in figures). Further, a first retaining slot 33 and a third retaining slot 34 different from the first retaining slot 33 are located between the first and second electrical-connection portions 31 and 32.

The second electrode element 40 is made of a metal or a conductive material. The second electrode element 40 has a third electrical-connection portion 41 and a fourth electrical-connection portion 42. The third and fourth electrical-connection portions 41 and 42 are respectively electrically connected to the die bond area 12 and the external power source. A second retaining slot 43 and a fourth retaining slot 44 different from the second retaining slot 43 are located between the third and fourth electrical-connection portions 41 and 42.

In this embodiment, the groove 13 further includes first, second, third and fourth concave electrode grooves 131, 132, 133 and 134. When the first and second electrode elements 30 and 40 are retained on the substrate 10, the first, second, third and fourth retaining slots 33, 43, 34 and 44 are respectively retained in the first, second, third and fourth electrode grooves 131, 132, 133 and 134 of the groove 13. In some embodiments, the first and second electrode elements 30 and 40 are formed on the substrate 10 by 3-D printing.

The sealing ring 50 is made of an insulating material, such as plastic or rubber. The sealing ring 50 is tightly embedded in a portion of the groove 13 and the first, second, third and fourth retaining slots 33, 43, 34 and 44 keep the first and second electrode elements 30 and 40 retained in the groove 13.

As shown in FIGS. 3 and 5, the first electrode groove 131 of the groove 135 has a first bottom surface 1311 and a first sidewall pair 1312 extended upward from two opposite sides of the first bottom surface 1311. A first opening 1313 is formed by the first sidewall pair 1312. The second electrode groove 132 of the groove 135 has a second bottom surface 1321 and a second sidewall pair 1322, extended upward from two opposite sides of the second bottom surface 1321. A second opening 1323 is formed by the second sidewall pair 1322.

The radial cross sections of the first and second retaining slots 33 and 43, the first electrode groove 131, the second electrode groove 132, and the groove 13 are concave rectangles, circles, trapezoids, ellipses, or semi-circles. In this embodiment, the radial cross sections are rectangles or trapezoids. The width W1 of radial cross section of the first bottom surface 1311 is greater than or equal to the width W2 of the radial cross section of the first opening 1313. The width W3 of the radial cross section of the second bottom surface 1321 is greater than or equal to the width W4 of the radial cross section of the second opening 1323.

In some embodiments, the width W1 is equal to the width W3, and the width W2 is equal to the width W4. The structures of the third and fourth retaining slots 34 and 44 are the same as the first and second retaining slots 33 and 43. Besides, the bottom of the sealing ring 50 corresponds to the shapes of the first, the second, the third, and the fourth retaining slots 33, 43, 34 and 44. In this embodiment, the bottom of the sealing ring 50 is a rectangle or a trapezoid. The widths W1 and W3 are greater than the widths W2 and W4, the radial cross sections of the first and second retaining slots 33 and 43 are concave trapezoids. Therefore, the sealing ring 50 is tightly retained in the first and second retaining slots 33 and 43.

As shown in FIG. 4, the illuminating device 1 further includes an adhesion layer 60 located at the surface of the groove 13. In other words, the adhesion layer 60 is located between the substrate 10 and the first and second electrode elements 30 and 40. Since the adhesion layer 60 is made of an insulating material, and the substrate 10 is insulated with the first and second electrode elements 30 and 40, the first and second electrode elements 30 and 40 can be retained on the substrate 10 by the adhesion layer 60. In some embodiments, the adhesion layer 60 is excluded in the groove 13. The first and second electrode elements 30 and 40 and the sealing ring 50 are retained in the groove 13.

In this embodiment, the light-emitting diode element 20 is a light-emitting diode chip, and further includes a light-emitting body 21 and an encapsulating glue 22 covering the light-emitting body 21. The encapsulating glue 22 includes a wavelength-conversion material. A first light beam with a wavelength $\lambda 1$ emitted by the light-emitting diode chip is converted to a second light beam with a wavelength $\lambda 2$ by the encapsulating glue 22. In some embodiments, the wavelength $\lambda 2$ is greater than the wavelength $\lambda 1$.

During the manufacturing process of the illuminating device 1, the first and second electrode elements 30 and 40 are disposed on the substrate 10 and retained in the groove 13. Next, the sealing ring 50 is disposed in the first, second, third, and fourth retaining slots 33, 43, 34 and 44, and the assembly of the illuminating device 1 is easily accomplished. Moreover, by the elastic force of the sealing ring 50, the first and second electrode elements 30 and 40 are retained between the substrate 10 and the sealing ring 50. Therefore, the problem of the conventional copper layer peeling off the substrate due to the deterioration of the insulation layer is solved.

FIG. 6 is a cross-sectional view of an illuminating device 1a in accordance with a second embodiment of the disclosure. In this embodiment, a radial cross section of the sealing ring 50a is a circle or an ellipse. The radial cross section of the groove 13 and the first and second retaining slots 33 and 43 are rectangles or trapezoids. The illuminating device 1 includes a filling glue 70 located between the first and second electrode elements 30 and 40 and the sealing ring 50. In some embodiments, the radial cross sections of the groove 13 and the first and second retaining slots 33 and 43 are circles or ellipses corresponding to the shapes of the sealing ring 50a.

In conclusion, the illuminating device of the present disclosure utilizes the sealing ring to tightly retain the electrode element on the substrate. Therefore, the electrode element is not easily separated from the substrate, and the yield rate of the illuminating device is improved.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An illuminating device, comprising:
a substrate having an upper surface, a die bond area located at the upper surface, and a groove around the die bond area;
a light-emitting diode element disposed on the die bond area;
a first electrode element having a first electrical-connection portion, a second electrical-connection portion, and a first retaining slot located between the first and second electrical-connection portions, wherein the first retaining slot is disposed in the groove, and the first and second electrical-connection portions are electrically connected to the die bond area and an external power source;
a second electrode element having a third electrical-connection portion, a fourth electrical-connection portion, and a second retaining slot located between the third and fourth electrical-connection portions, wherein the second retaining slot is disposed in the groove, and the third and fourth electrical-connection portions are electrically connected to the die bond area and the external power source; and a sealing ring embedded in a portion of the groove and the first and second retaining slots to keep the first and second electrode elements retained in the groove.

2. The illuminating device as claimed in claim 1, wherein the light-emitting diode element is a light-emitting diode chip or a light-emitting diode package.

3. The illuminating device as claimed in claim 2, wherein the groove has a first and a second bottom surfaces, and a first and a second sidewall pairs respectively extended upward from the first and second bottom surfaces, a first opening is formed by the first sidewall pair, and a second opening is formed by the second sidewall pair.

4. The illuminating device as claimed in claim 3, wherein widths of the radial cross sections of the first and second bottom surfaces are greater than or equal to widths of the radial cross sections of the first and second openings.

5. The illuminating device as claimed in claim 2, wherein a radial cross section of the groove is a concave rectangle, a concave circle, a concave trapezoid, a concave ellipse, or a concave semi-circle.

6. The illuminating device as claimed in claim 2, wherein a radial cross section of the sealing ring is a rectangle, a circle, a trapezoid or an ellipse.

7. The illuminating device as claimed in claim 2, wherein a cross section of the groove is a rectangle or a circle.

8. The illuminating device as claimed in claim 2, wherein the groove further comprises a first and a second concave electrode groove, and the first and second retaining slots are respectively retained in the first and second electrode grooves.

9. The illuminating device as claimed in claim 8, wherein the first electrode element comprises a third retaining slot located between the first and second electrical-connection portions different from the first retaining slot, and the second electrode element comprises a fourth retaining slot located between the third and fourth electrical-connection portions different from the second retaining slot, wherein the sealing ring is also embedded in the third and fourth retaining slots.

10. The illuminating device as claimed in claim 9, wherein the groove comprises a third and a fourth concave electrode grooves respectively retained in the third and fourth electrode grooves.

11. The illuminating device as claimed in claim 10, further comprising an adhesion layer located in the groove.

12. The illuminating device as claimed in claim 11, wherein the adhesion layer comprises an insulating material.

13. The illuminating device as claimed in claim 12, further comprising a filling glue located between the first and second electrode elements and the sealing ring.

14. The illuminating device as claimed in claim 13, wherein the light-emitting diode element is a light-emitting diode chip and comprises an encapsulating glue having a wavelength-conversion material, wherein a first light beam with a wavelength $\lambda 1$ emitted by the light-emitting diode chip is converted to a second light beam with a wavelength $\lambda 2$ by the encapsulating glue, and the wavelength $\lambda 2$ is greater than the wavelength $\lambda 1$.

15. The illuminating device as claimed in claim 1, wherein the substrate is a thermal conductive substrate.

16. The illuminating device as claimed in claim 15, wherein the thermal conductive substrate comprises a ceramic material or a thermosetting plastic material.

\* \* \* \* \*